United States Patent
Beer

(10) Patent No.: US 7,302,622 B2
(45) Date of Patent: *Nov. 27, 2007

(54) INTEGRATED MEMORY HAVING A TEST CIRCUIT FOR FUNCTIONAL TESTING OF THE MEMORY

(75) Inventor: Peter Beer, Fontainbleau (FR)

(73) Assignee: Infineon Technologies, AG, Neubiberg (DE)

( * ) Notice: Subject to any disclaimer, the term of this patent is extended or adjusted under 35 U.S.C. 154(b) by 190 days.

This patent is subject to a terminal disclaimer.

(21) Appl. No.: 10/920,210

(22) Filed: Aug. 18, 2004

(65) Prior Publication Data

US 2005/0041497 A1 Feb. 24, 2005

(30) Foreign Application Priority Data

Aug. 18, 2003 (DE) .................................. 103 37 854

(51) Int. Cl.
*G11C 29/26* (2006.01)
*G11C 29/40* (2006.01)

(52) U.S. Cl. .................. 714/718; 714/733; 714/719
(58) Field of Classification Search ............... 714/718, 714/734, 724, 735, 733, 25, 42, 54, 702, 714/719; 365/200, 201
See application file for complete search history.

(56) References Cited

U.S. PATENT DOCUMENTS

| | | | |
|---|---|---|---|
| 5,406,566 A * | 4/1995 | Obara | 714/719 |
| 6,032,274 A | 2/2000 | Manning | |
| 6,157,584 A * | 12/2000 | Holst | 365/200 |
| 6,357,027 B1 * | 3/2002 | Frankowsky | 714/738 |
| 6,721,230 B2 | 4/2004 | Weitz | |
| 2004/0015757 A1 | 1/2004 | Ohlhoff et al. | |

FOREIGN PATENT DOCUMENTS

DE 10110272 A1 9/2002

* cited by examiner

*Primary Examiner*—Cynthia Britt
*Assistant Examiner*—Dipakkumar Gandhi
(74) *Attorney, Agent, or Firm*—Edell, Shapiro & Finnan, LLC

(57) ABSTRACT

An integrated memory having a plurality of memory banks includes a test circuit for functional testing of the memory. A plurality of secondary sense amplifiers are assigned to a different one of the memory banks. The test circuit includes a data generator for generating read comparison data. A plurality of comparison circuits are assigned to a different one of the memory banks to compare test data read from the assigned memory bank with the read comparison data. A first input of the respective comparison circuit can be connected to the secondary sense amplifier without interposition of the read/write data lines. A second input can be connected to the read/write data lines to receive the read comparison data supplied by the data generator. An output signal of the respective comparison circuit depends on the comparison result of a data comparison of the first and second inputs.

8 Claims, 5 Drawing Sheets

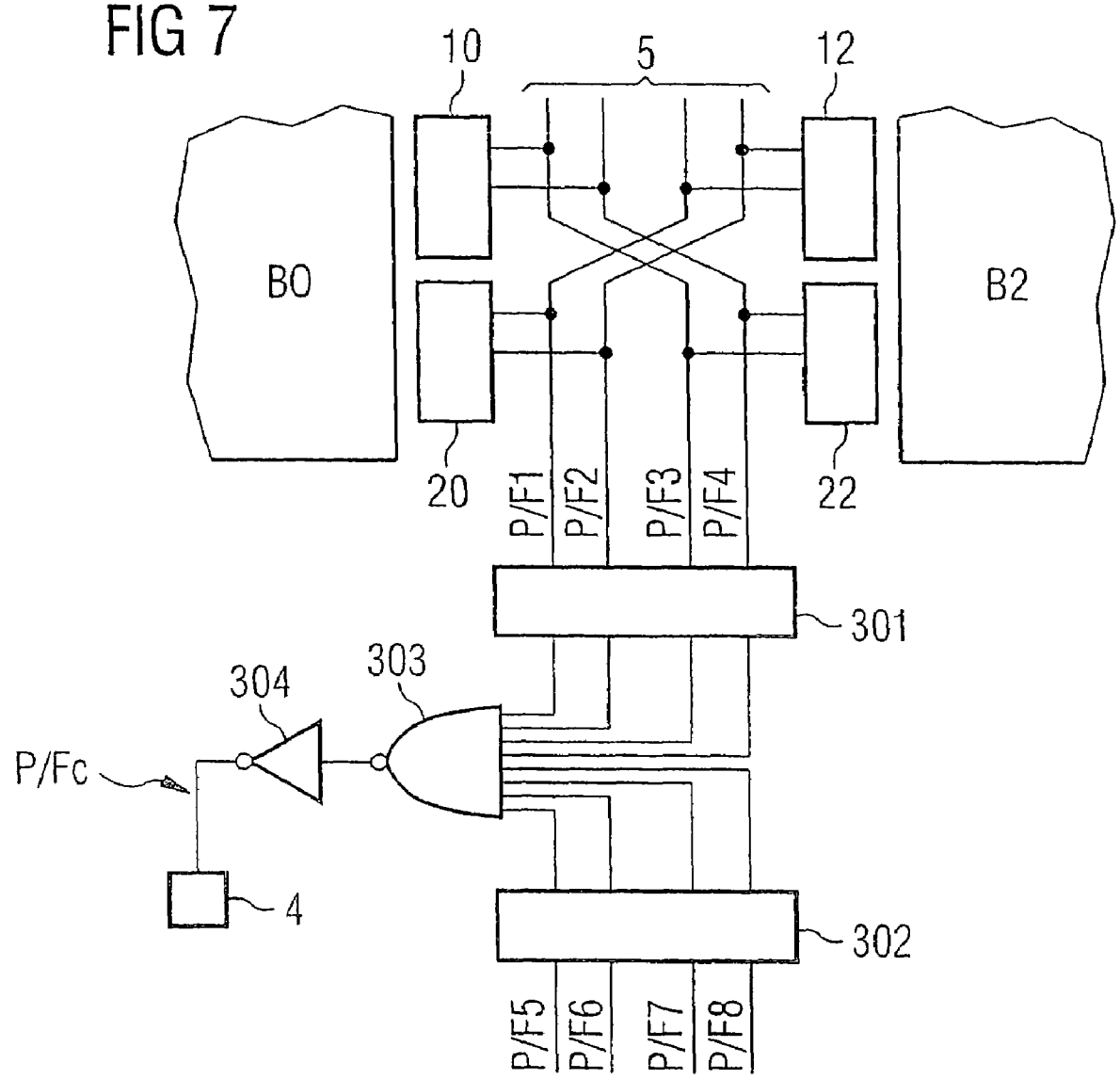

INTEGRATED MEMORY HAVING A TEST CIRCUIT FOR FUNCTIONAL TESTING OF THE MEMORY

CROSS REFERENCE TO RELATED APPLICATIONS

This application claims priority under 35 USC §119 to German Application No. 10337854.5, filed on Aug. 18, 2003, and titled "Integrated Memory Having a Test Circuit for Functional Testing of the Memory," the entire contents of which are hereby incorporated by reference.

FIELD OF THE INVENTION

This invention relates to an integrated memory having a test circuit for functional testing of the memory.

BACKGROUND

Integrated memories, for example, in the form of DRAMs (dynamic random access memories), are generally subject to comprehensive functional tests in the fabrication process. Inter alia, the functional tests identify defective memory cells or defective column lines or row lines. As memory size increases, the costs of functional tests make up an ever greater proportion of the overall production costs of a memory. In order to lower the test costs, however, methods such as test modes for compressing data or additional test logic, for example, in the form of BIST (built-in self-test), are increasingly being developed.

Integrated memories generally have redundant memory cells for repairing defective memory cells. The redundant memory cells are usually combined to form redundant row lines or redundant column lines that can replace regular lines having defective memory cells in address terms. As a result, integrated memories, in particular, DRAMs, are still fabricated economically with the integration densities that are achieved nowadays. An integrated memory is tested, for example, by an external test device and a programming of redundant elements is subsequently performed based on a redundancy analysis. In order to be able to carry out a repair of a memory in a targeted manner, it is necessary, in corresponding tests or test sequences, to identify defects and store them together with the associated address on the external test system. The addresses of those tested memory cells, which have been detected as defective, are stored in a defect address memory, i.e., fail bit map, in order to replace these memory cells by defect-free redundant memory cells in a subsequent step on the basis of the stored addresses. The repair solution specific to each memory can subsequently be calculated in the test system based on the fail bit map.

In order to minimize the test costs per memory chip, the memory chips are tested in parallel to an increasing extent. This trend is supplemented by the increasing use of test circuits that are provided on the memory chip, such as, for example, circuits for carrying out built-in self-tests (BIST) or compression test modes. Such circuits support an externally connected test unit for functional testing of the memory chip. With the use of a BIST, the test control (address and data generation, command sequence) is generally effected completely in the memory chip.

Increasingly problematical is that the calculation of the repair solution upon establishing functional defects in the memory chip still must be effected externally. Therefore, it is necessary to transmit the redundancy-conforming defect data to an external unit even in the case of a BIST-based test cycle. The external unit receives the defect data and calculates a repair solution therefrom. In the case of a high degree of parallelism and in the case of high storage densities, such as are achieved in the present-day state of development, such transmission poses a problem for a number of reasons. First, the defect data can be transmitted in highly parallel fashion from each individual memory chip. This requires a correspondingly high number of expensive connection channels at the external test system or data acquisition system. Furthermore, the wiring on the load boards of the test systems may become very complex. An alternative to this is to reduce the number of output lines per memory chip to be tested and to transmit the addresses of the defect data identified in the chip serially to the external test unit. However, this requires correspondingly more test time and thus likewise leads to raising test costs.

SUMMARY

An integrated memory can include a test circuit for functional testing of the memory, which enables a relatively short time duration for carrying out a functional test of the memory. An integrated memory according to the invention has a plurality of memory banks that are in each case accessed independently of one another. Furthermore, a plurality of secondary sense amplifiers are provided. The secondary sense amplifiers are, in each case, assigned to a different one of the memory banks for evaluation and amplification of data signals of the assigned memory bank. Read/write data lines are connected to the respective secondary sense amplifiers in order to connect the respective secondary sense amplifiers to a data output circuit of the memory. Furthermore, a respective one of the read/write data lines is connected to at least two of the plurality of secondary sense amplifiers. The test circuit according to the invention has a data generator for generating read comparison data for a functional test, which can be connected to the read/write data lines in order to distribute the read comparison data to the memory banks for the functional testing thereof. Furthermore, the test circuit includes a plurality of comparison circuits that are, in each case, assigned to a different one of the memory banks for comparing data read from the assigned memory bank with the read comparison data. In this case, the comparison circuit has a respective first input, second input, and an output. The output signal can be tapped off depending on the comparison result of a data comparison at the first and second inputs. The first input of a respective comparison circuit can be connected to the secondary sense amplifier of the assigned memory bank without interposition of the read/write data lines, and the respective second input can be connected to the read/write data lines in order to receive the read comparison data supplied by the data generator.

According to the invention, generation of the read comparison data is centrally provided with the aid of the data generator. Comparison of the read-out data of the respective memory banks with the read comparison data is performed locally at the respective secondary sense amplifier of the respective memory bank. Since, in a functional test, the read comparison data are generally the same for the memory banks of the memory, it is possible, with the aid of the invention, for the secondary sense amplifiers of the memory to be supplied with read comparison data in parallel by the read/write data lines. This enables the read comparison data to be written in parallel, particularly, in the case of a circuit arrangement of an integrated memory in which a plurality of memory banks or sense amplifiers are connected to a shared read/write data line. Since comparison of the read-out data with the read comparison data is performed locally at each of the secondary sense amplifiers, it is possible, according to the invention, for the secondary sense amplifiers of the respective memory banks also to operate in parallel during the read-out of the data from the respective memory bank. Thus, a relatively short time duration is required to carry out a functional test of the memory.

An activatable data changing circuit, in particular, in the form of an inverter circuit, is provided for each memory bank. The inverter circuit is connected to one of the read/write data lines and to the secondary sense amplifier of the assigned memory bank. Such a data changing circuit receives a desired write datum supplied by the data generator and forwards it to the secondary sense amplifier with a changed data state. In this case the respective data changing circuit, for instance, has an activation input that is connected to the output of the comparison circuit of the assigned memory bank. In this case, the data changing circuit changes the received data state in an activated state and leaves the received data state unchanged in a deactivated state.

In the case of a defective memory cell, an erroneous data signal is written back to the relevant memory bank again by a changed data state, in particular, the inverse, of a subsequent desired write datum being written to the relevant memory bank. At a later point in time, the erroneous data signal output externally to a test system. An error, once it has occurred, is thus "drawn through" over a plurality of test cycles until the error is output to the external test system. In the most favorable case, a complete external read process is carried out once for the functional test. This shortens test times in many applications. Furthermore, the flexibility when writing test systems increases since less consideration can be shown for the correct transmission of the read data or defect addresses externally. In particular, no turnaround times occur on the external data lines, which can take up a considerable period of time in present-day test systems.

The respective data changing circuit is connected to a plurality of secondary sense amplifiers and to a plurality of read/write data lines in order to forward desired write data supplied by the data generator to the plurality of secondary sense amplifiers. According to the invention, an identified error datum is written back to a plurality of distributed memory cells by virtue of the fact that, in the event of a defect having been identified, in each case, in particular, the inverse of a desired write datum is written to the memory cells via the respective secondary sense amplifiers. The probability of an error datum is recognized during a next read-out process is thus increased to, for instance, almost 100 percent. Thus, in a functional test, a corresponding pass/fail result is output externally with the last read-out step. For example, in this case, a data compression is effected to the extent that a defect information item in relation to four data lines of a group is compressed to a pass/fail information item at the output of the comparison circuit. A redundancy-conforming compression is involved in this case, if a common repair solution is calculated with regard to a later repair of the memory in relation to the group of data lines.

BRIEF DESCRIPTION OF THE FIGURES

The invention is explained in more detail below with reference to the figures that are illustrated in the drawing and illustrate exemplary embodiments with respect to the present invention.

FIG. 7 shows an embodiment of a memory according to the invention with a read-out circuit.

DETAILED DESCRIPTION

Figure 1:
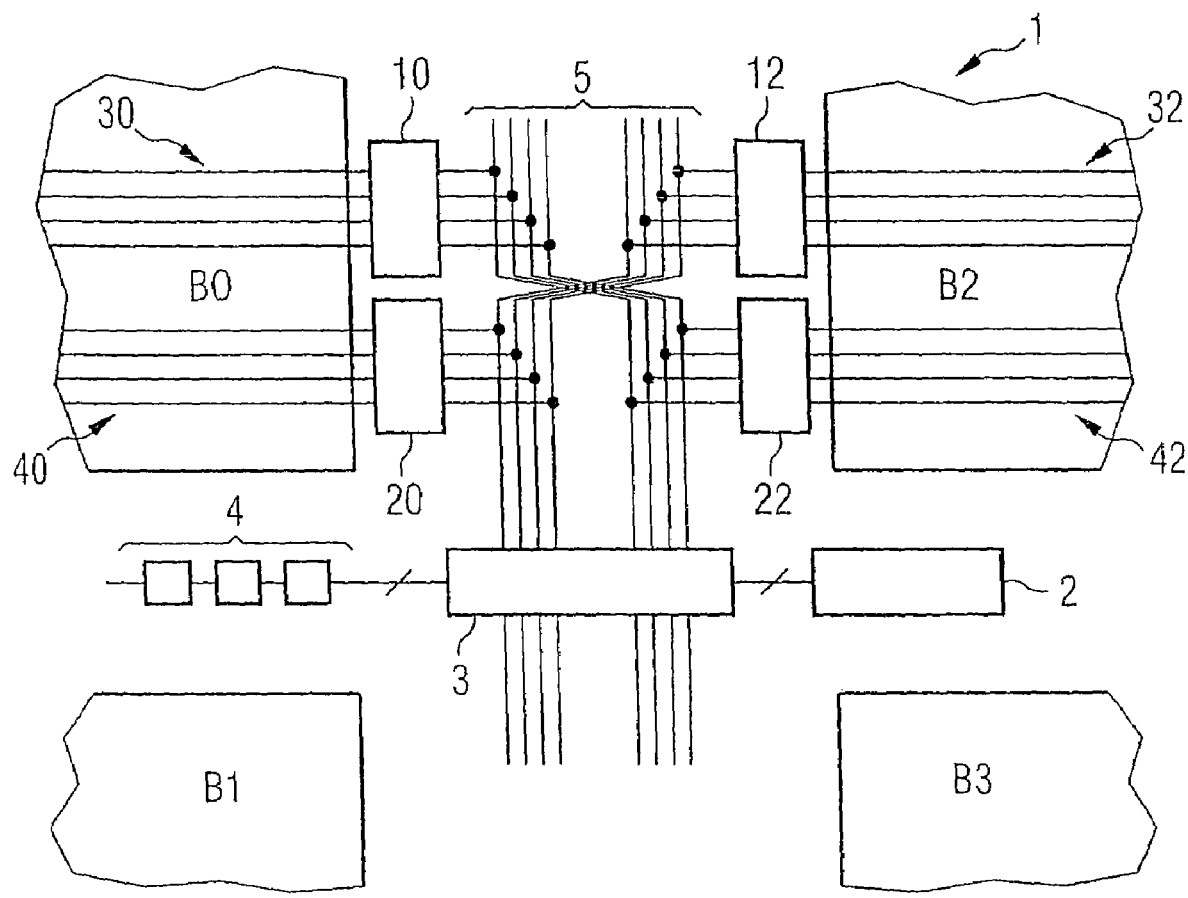
FIG. 1 shows a schematic overview of a memory with a plurality of memory banks and associated secondary sense amplifiers.

FIG. 1 illustrates a schematic overview of a memory according to the invention. The memory 1 has a plurality of memory banks B0, B1, B2, B3 that subdivide the memory 1 into a plurality of respective partial areas. Each of the memory banks B0, B1, B2, B3 include a number of memory cells arranged in matrix form along word lines and bit lines, which are not illustrated in FIG. 1 for the sake of clarity. A plurality of data lines are in each case routed from each of the memory banks B0, B1, B2, B3, illustrated, for example, based on the groups of data lines 30, 40, 32, and 42 of the memory banks B0 and B2, respectively. Each group of data lines is connected to a block of secondary sense amplifiers. For example, the group of data lines 30 is connected to secondary sense amplifiers of the sense amplifier block 10. Correspondingly, the further groups of data lines 32, 40, 42 illustrated are connected to respectively assigned secondary sense amplifiers of respective sense amplifier blocks 12, 20, and respectively 22. In the present exemplary embodiment, a group of data lines includes four individual data lines that are connected to a secondary sense amplifier in the respective sense amplifier block. However, in principle, the invention can be applied to an embodiment in which, for example, instead of a group of data lines, an individual data line is routed from the respective memory bank and connected to a secondary sense amplifier.

The secondary sense amplifiers in the sense amplifier blocks 10 to 22 are connected to read/write data lines 5 (also referred to as RWDL lines) in order that the data signals of a memory bank, which are evaluated and amplified in the sense amplifiers, are forwarded to a data output circuit of the memory via a central multiplexer 3. The latter selects the valid read/write data lines by the bank address. In the present exemplary embodiment, the data output circuit is illustrated schematically by individual output circuits 4, for example, in the form of output register circuits or output drivers. Furthermore, the embodiment in accordance with FIG. 1 is provided with a central data generator 2 for generating read comparison data for a functional test of the memory. The data generator 2 is assigned jointly to the memory banks and can be connected to the read/write data lines 5 via the multiplexer 3 for distribution of the read comparison data to the memory banks B0 to B3 for the functional testing thereof.

During a functional test, both the write data and the read comparison data are generated on the memory chip. Writable registers are available, which can be set externally before or during the functional test, such as, in particular, the data generator 2. Moreover, these data can be changed on the memory chip by programmable scramblers. The address bits required for scrambling are correspondingly made available to the test circuit in order to generate the write data and the read comparison data.

FIG. 1 shows a schematic construction of a typical SDRAM memory chip with four memory banks. In the case of such a memory, the data output lines from one of the memory cells through to the secondary sense amplifiers are generally organized hierarchically. The individual hierarchical stages of the data output lines are connected to one another by respective multiplexer circuits. These multiplexer circuits are driven by respective parts of the address, for example, word line address and bit line address, in order to connect the respectively addressed partial area of a memory bank to the corresponding secondary sense amplifier. This hierarchically organized construction is not illustrated in the present exemplary embodiment for the sake of clarity. The groups of data lines 30, 32, 40, 42 in accordance with FIG. 1 show the last hierarchical stage of the data output lines of a memory bank (also referred to as MDQ lines), which are routed from a memory bank.

Figure 2:
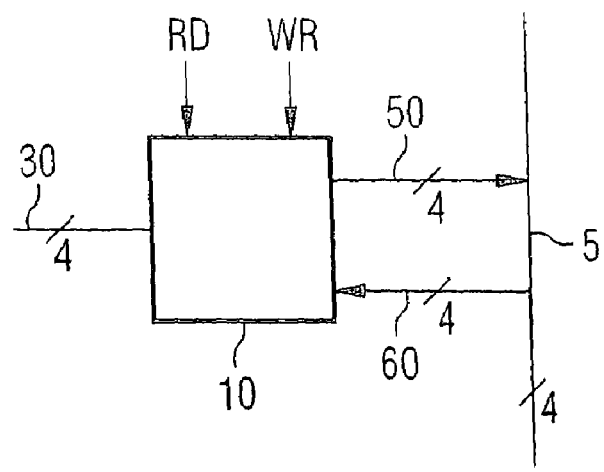
FIG. 2 shows a more detailed view of an interconnection of a block of secondary sense amplifiers with a plurality of data lines.

FIG. 2 shows a more detailed view of an interconnection of a block of secondary sense amplifiers with a plurality of data lines. The secondary sense amplifiers in the sense amplifier block 10 can be driven by a read command signal RD and a write command signal WR. When data signals are read out from the relevant memory bank via the group of data lines 30, the secondary sense amplifiers amplify the differential signal that is respectively supplied on the data lines and pass, via the data line 50, a respectively amplified single signal onto a corresponding line of the read/write data lines 5. During a write process, a signal supplied on the read/write data lines 5 is sent to the sense amplifier block 10 via the data lines 60, the secondary sense amplifiers of the sense amplifier block 10 converting the signal to be written into a differential signal for forwarding to the group of data lines 30.

Figure 3:
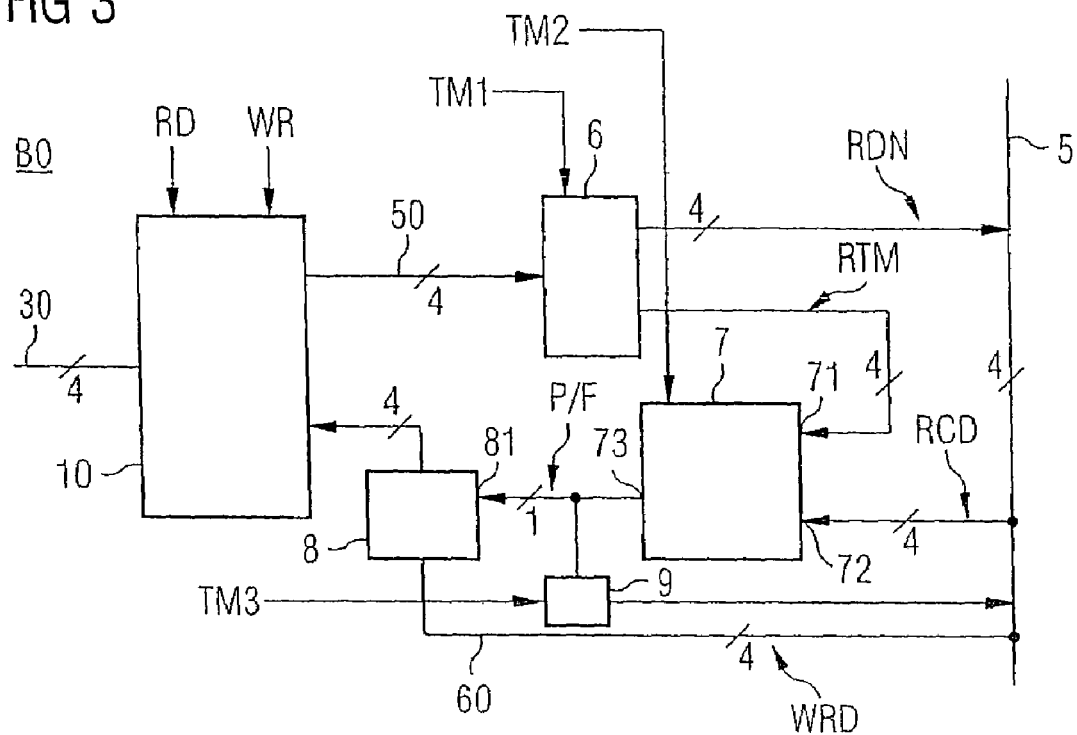
FIG. 3 shows a detailed view of an embodiment of a memory according to the invention with a test circuit for functional testing.

FIG. 3 shows a detailed view of an embodiment of a memory according to the invention with a test circuit for functional testing of the memory. The sense amplifier block 10, as already explained in greater detail with reference to FIGS. 1 and 2, is connected to the multiplexer circuit 6 via the data lines 50 in the present exemplary embodiment. The multiplexer circuit can be driven by a test mode signal TM1. The multiplexer circuit 6 connects the data lines 50 to the read/write data lines 5 for a read-out process during normal operation for reading out the read data RDN. Upon activation of the test mode signal TM1, by contrast, the data lines 50 are connected to a comparison circuit 7. In accordance with the view as shown in FIG. 3, the comparison circuit 7 is assigned to the memory bank B0 and serves for comparing test data RTM read from the memory bank B0 via the group of data lines 30 with the read comparison data RCD supplied by the data generator 2 in accordance with FIG. 1. In this case, a first input 71 of the comparison circuit 7 can be connected to the secondary sense amplifiers of the sense amplifier block 10 of the memory bank B0 via the multiplexer circuit 6 without the interposition of the read/write data lines 5. The second input 72 of the comparison circuit 7 is connected to the read-write data lines 5. An output signal, i.e., a pass/fail signal, can be tapped off at the output 73 of the comparison circuit 7. The state of the output signal depends on the comparison results of a data comparison at the inputs 71, 72.

The output 73 of the comparison circuit 7 is connected to an activation input 81 of an inverter circuit 8, which, for its part, is connected via the data lines 60 to the read/write data lines 5 and to the sense amplifier block 10. In the present exemplary embodiment, the comparison circuit 7 calculates a common pass/fail information item P/F from the comparison of four test data RTM with corresponding read comparison data RCD. This information is provided in a register at the output 73 of the comparison circuit 7 at the end of each read process. It has the effect at the inverter circuit 8 that the desired write data WRD present via the read/write data lines 5 are inverted in the case of a previously detected error (pass/fail signal P/F is "1", for example) and are forwarded in this state to the sense amplifier block 10. Furthermore, the pass/fail data can also be output directly to one of the read/write data lines 5 by a test mode signal TM3, which drives an output circuit 9. For proper functioning of the memory in a normal operation, the output 73 of the comparison circuit 7, with the test mode signal TM2 not set, i.e., with the comparison circuit 7 not activated, is programmed such that the inverter circuit 8, in such a deactivated state, leaves unchanged a received data state of a write datum present on the data lines 60.

In the present exemplary embodiment, a data compression is effected to the extent that a defect information item in relation to four data lines of the group 30 is compressed to a pass/fail information item P/F at the output of the comparison circuit 7. A redundancy-conforming compression is involved in this case, however, if a common repair solution is calculated with regard to a later repair of the memory in relation to the group of data lines 30. Thus, in the present exemplary embodiment, a group of data lines is assigned to a respective comparison circuit. It is possible to tap off an output signal, i.e., a pass/fail signal, at the output of the comparison circuit. The state of the output signal represents a compressed comparison result of a comparison of respective read-out data with read comparison data with regard to the group of data lines.

In the present exemplary embodiment in accordance with FIG. 3, an identified error is written to a plurality of distributed memory cells of the memory bank B0. Correspondingly, the inverter circuit 8 is connected to a plurality of secondary sense amplifiers in the sense amplifier block 10 and to a plurality of read/write data lines 5 in order that the desired write data WRD supplied by the data generator 2 in accordance with FIG. 1 are forwarded to the corresponding memory cells via the secondary sense amplifiers. In this case, the inverse of the next desired write data is written to the relevant memory cells and the read datum does not have to be driven externally. The probability of the error being found again during the next read-out process is almost 100 percent. Thus, in the test cycle, the last read-out step drives the corresponding pass/fail results externally. The invention thus is no longer bound to speed restrictions of an external test system, for example, even during the read step of a test cycle. The secondary sense amplifiers in the corresponding sense amplifier blocks of the memory banks can operate in parallel, even during the read-out of test data. Therefore, it is no longer necessary to rely on transporting the test data, for example, to the centrally generated read comparison data. Therefore, the bottleneck of the read/write data lines, which are jointly used by a plurality of memory banks, no longer is taken into account for a test cycle.

Figure 4:
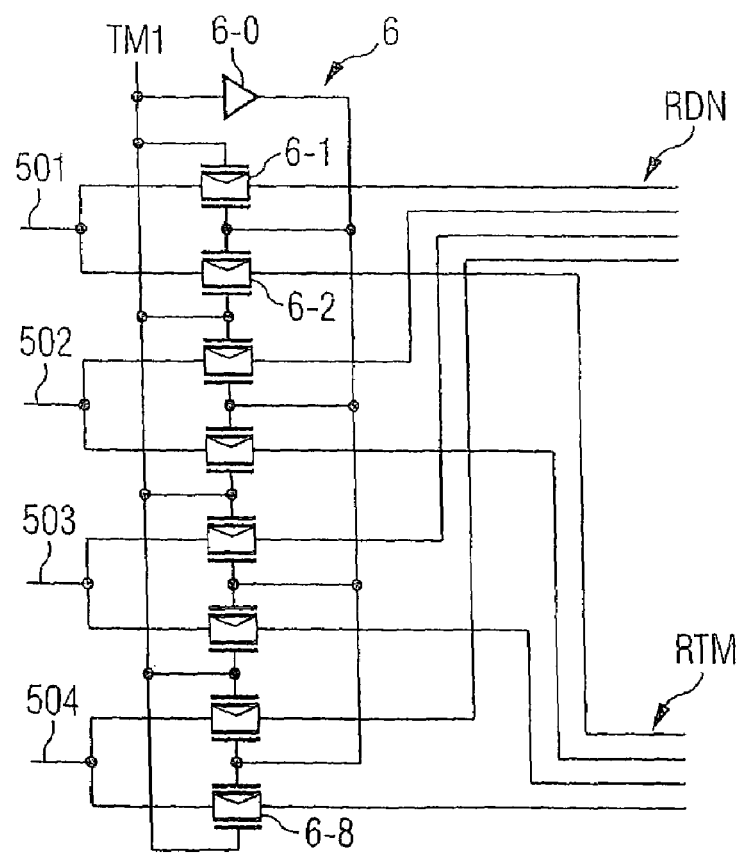
FIG. 4 shows an embodiment of a multiplexer circuit in accordance with the embodiment as shown in FIG. 3.

FIG. 4 shows an embodiment of a multiplexer circuit 6 in accordance with the embodiment as shown in FIG. 3. On the input side, the multiplexer circuit 6 is connected to a respective secondary sense amplifier via the data lines 501 to 504, which form the group of data lines 50. In the present example, eight transfer gates 6-1 to 6-8 driven by the test mode signal TM1 are provided for four data lines 501 to 504. In this case, every second transfer gate is driven with an inverted test mode signal TM1 at its PFET control terminal via an inverter 6-0. The multiplexer circuit 6 is used to effect a changeover between the outputting of read data RDN in normal operation of the memory and test data RTM in test operation of the memory.

Figure 5:
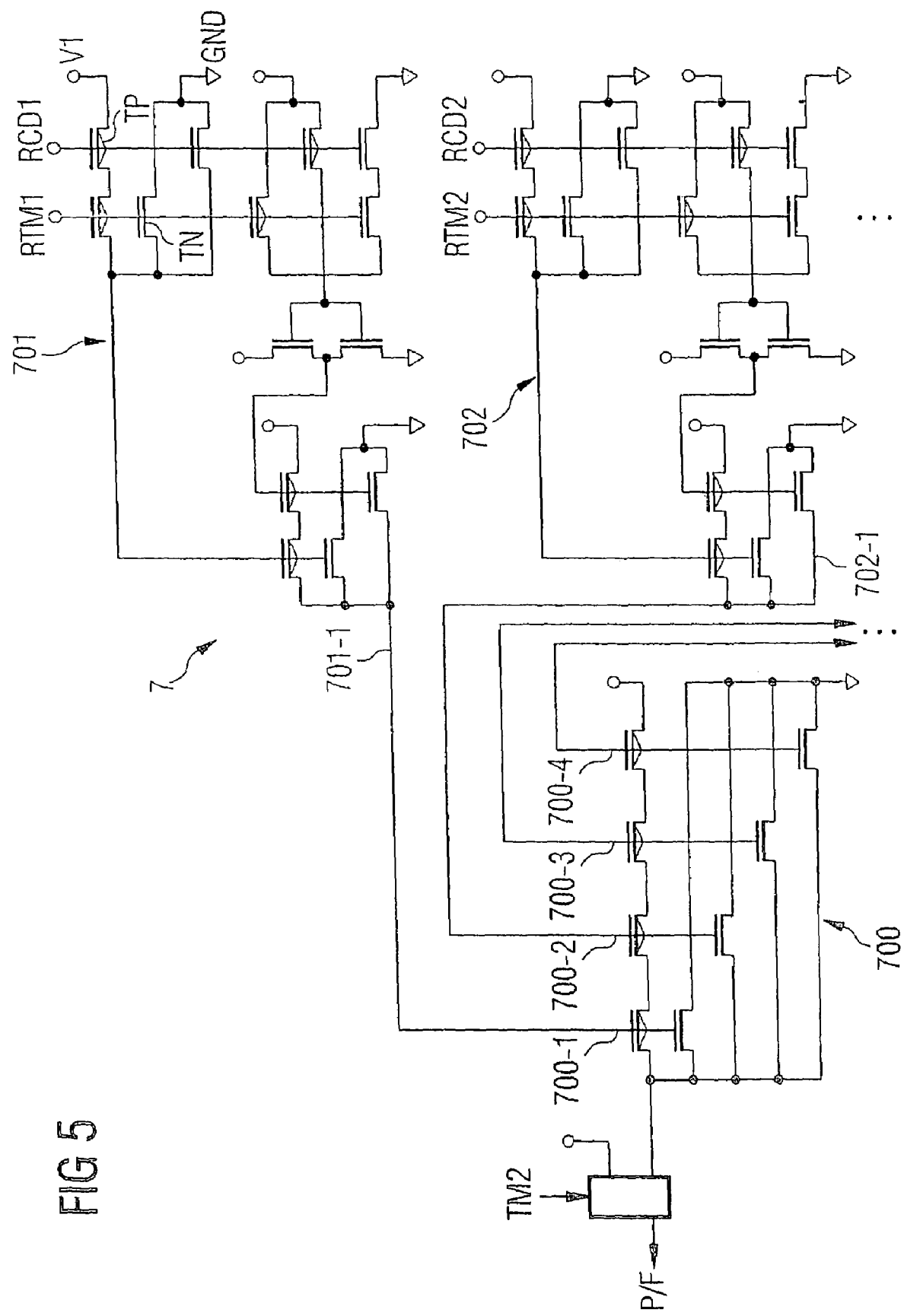
FIG. 5 shows an embodiment of a comparison circuit in accordance with the embodiment as shown in FIG. 3.

FIG. 5 illustrates in greater detail an embodiment of a comparison circuit according to the exemplary embodiment as shown in FIG. 3. FIG. 5 illustrates a comparison circuit 7 that performs a redundancy-conforming compression of test data of a group of data lines to a common pass/fail result. An EXCLUSIVE-OR circuit 701, 702 is provided for each data line in order to compare a test datum RTM1 or RTM2 output via the respective data line with a read comparison datum RCD1, RCD2. For example, a first data line of the group of data lines 30 in accordance with FIG. 3 is assigned to the EXCLUSIVE-OR circuit 701 in order to compare a test datum RTM1 output via the data line with the read comparison datum RCD1. The EXCLUSIVE-OR circuits 701, 702 are formed by PFET transistors TP and NFET transistors PN in the interconnection specified in FIG. 5. V1 designates a supply voltage, and GND designates a reference voltage of the memory. Respective outputs 701-1, 702-1 of the EXCLUSIVE-OR circuits 701, 702 are connected to a respective input 700-1 to 700-4 of a jointly assigned NOR circuit 700. The latter serves in particular for compression of the signals present at the outputs 701-1 and 702-1 to a common pass/fail signal P/F. For the sake of clarity, FIG. 5 shows only a portion of the EXCLUSIVE-OR circuits that are to be provided. In this case, it must be taken into account that a dedicated EXCLUSIVE-OR circuit is to be provided for a respective data line of a group of data lines which is intended to be compressed to form a common compressed pass/fail result.

Figure 6:
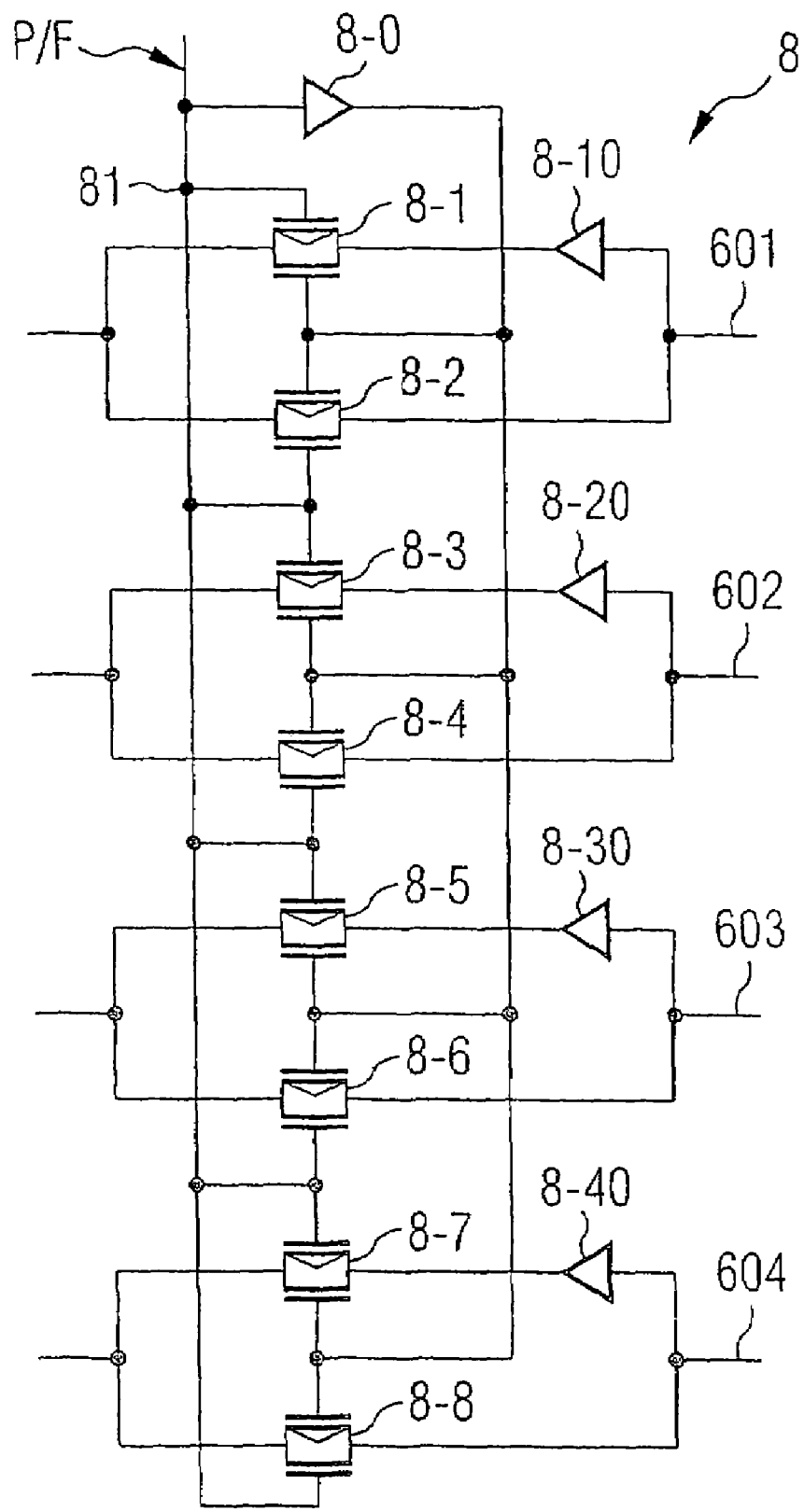
FIG. 6 shows an embodiment of an inverter circuit in accordance with the exemplary embodiment as shown in FIG. 3.

FIG. 6 illustrates in greater detail an embodiment of an inverter circuit 8 in accordance with the exemplary embodiment as shown in FIG. 3. The data lines 601,602,603,604 form the group of data lines 60 in accordance with FIG. 3. The data lines 601,602,603,604 are connected to in each case two of the transfer gates 8-1 to 8-8, every second transfer gate being connected to one of the data lines 601,602,603,604 via a respective inverter 8-10 to 8-40. The transfer gates 8-1 to 8-8 can be controlled by the pass/fail signal P/F at the input 81 of the inverter circuit 8. The transfer gates 8-2, 8-4, 8-6 and 8-8 are driven by an inverted pass/fail signal P/F via the inverter 8-0. This ensures that the inverter circuit 8 performs an inversion of a received data state on the data lines 601,602,603,604 in an activated state and leaves the respectively received data state unchanged in a deactivated state.

FIG. 7 shows an embodiment of a memory according to the invention which is provided with an additional read-out circuit for reading out pass/fail results. The read-out circuit has a combination circuit 303 in the form of a NAND gate connected to the read/write data lines 5 via respective multiplexers 301, 302. For the sake of clarity, FIG. 7 shows a reduced number of read/write data lines 5. The inputs of the combination circuit 303 are connected to respective lines of the read/write data lines 5 via the multiplexer 301 and 302. The output of the NAND gate 303 is connected via the inverter 304 to the data output circuit 4, for example, to an output register.

By the NAND gate, the pass/fail signals P/F1 to P/F8 of the respective memory banks B0 to B3 that are to be output via the read/write data lines 5 are combined to form a compressed pass/fail signal P/Fc, which is forwarded to the output signal 4. Thus, reading in the post-fuse, i.e., after the repair of the memory, can be implemented relatively more in parallel. In this case, an exact failure address is no longer of interest after the repair, since a defective memory chip is rejected in the case of a defect. The local compression of a plurality of read data to a pass/fail datum makes it possible to supply a corresponding multiplied number of pass/fail data on the read/write data lines 5 present. These pass/fail data (in the example, P/F1 to P/F8) can then be compressed centrally to form a single pass/fail datum (P/Fc in the example) and be driven externally via a single data terminal pad.

The above description of the exemplary embodiments in line with the present invention serves merely for illustrative purposes and not to limit the invention. The invention allows various changes and modifications without departing from the scope of the invention and its equivalents.

LIST OF REFERENCE SYMBOLS

| | |
|---|---|
| 1 | Memory |
| 2 | Data generator |
| 3 | Multiplexer |
| 4 | Data output circuit |
| 5 | Read/write data lines |
| 6 | Multiplexer circuit |
| 7 | Comparison circuit |
| 8 | Inverter circuit |
| 9 | Output circuit |
| 10, 20 | Sense amplifier block |
| 12, 22 | Sense amplifier block |
| 30, 40 | Data lines |
| 32, 42 | Data lines |
| 50, 60 | Data lines |
| 71, 72 | Input |
| 73 | Output |
| 81 | Activation input |
| 501 to 504 | Data lines |
| 601 to 604 | Data lines |
| 700 | NOR circuit |
| 701, 702 | EXCLUSIVE-OR circuit |
| 701-1, 702-1 | Output |
| 700-1 to 700-4 | Input |
| 301, 302 | Multiplexer |
| 303 | NAND circuit |
| 304 | Inverter |
| 6-0 | Inverter |
| 6-1 to 6-8 | Transfer gate |
| 8-0 | Inverter |
| 8-1 to 8-8 | Transfer gate |
| 8-10 to 8-40 | Inverter |
| B0 to B3 | Memory bank |
| RD | Read command signal |
| WR | Write command signal |
| TM1 to TM3 | Test mode signal |
| RDN | Read data |
| RTM | Test data |
| RTM1, RTM2 | Test data |
| RCD | Read comparison data |
| RCD1, RCD2 | Read comparison data |
| WRD | Desired write data |
| V1 | Supply voltage |
| GND | Reference voltage |
| P/F | Pass/fail signal |
| P/F1 to P/F8 | Pass/fail signal |
| P/Fc | Compressed pass/fail signal |
| TP | PFET transistor |
| TN | NFET transistor |

What is claimed:

1. An integrated memory having a test circuit for functional testing of the memory, comprising:
    a plurality of memory banks, each memory bank being independently accessible;
    a plurality of secondary sense amplifiers for evaluation and amplification of data signals from an assigned memory bank, each secondary sense amplifier being assigned to a different one of the memory banks;
    read/write data lines connected to respective secondary sense amplifiers to connect the respective secondary sense amplifiers to a data output circuit of the memory, one of the read/write data lines being connected to at least two of the plurality of secondary sense amplifiers;
    a data generator for generating read comparison data, the data generator being connected to the read/write data lines in order to distribute the read comparison data to the memory banks for the functional testing thereof;
    a plurality of comparison circuits for comparison of data read from the assigned memory bank with the read comparison data, each comparison circuit being assigned to a different one of the memory banks, each comparison circuit having a respective first input, second input, and output, wherein an output signal is adapted to be tapped off depending on a result of a data comparison at the first and second inputs, the respective first input being connected to the secondary sense amplifier without interposition of the read/write data lines, the respective second input being connected to the read/write data lines to receive the read comparison data supplied by the data generator.

2. The integrated memory as claimed in claim 1, further comprising:
    an activatable data changing circuit for each memory bank, the activatable data changing circuit for receiving a desired write datum supplied by the data generator and for forwarding the write datum to the secondary sense amplifier with a changed data state, the activatable data changing circuit being connected to one of the read/write data lines and to the secondary sense amplifier of the assigned memory bank.

3. The integrated memory as claimed in claim 2, wherein the respective activatable data changing circuit has an activation input connected to the output of the comparison circuit of the assigned memory bank, the activatable data changing circuit changing the received data state in an activated state and leaving the received data state unchanged in a deactivated state.

4. The integrated memory as claimed in claim 2, wherein the respective activatable data changing circuit has an inverter circuit.

5. The integrated memory as claimed in claim 2, wherein the respective activatable data changing circuit is connected to a plurality of secondary sense amplifiers and to a plurality of read/write data lines to forward desired write data supplied by the data generator to the plurality of secondary sense amplifiers.

6. The integrated memory as claimed in claim 1, wherein, for each memory bank, a plurality of data lines are led from the memory bank and connected to an assigned secondary sense amplifier, and
    a group of data lines is jointly assigned to a respective comparison circuit, wherein a state of the output signal represents a compressed comparison result of a comparison of data, respectively, read out with read comparison data with regard to the group of data lines.

7. The integrated memory as claimed in claim 6, wherein the comparison circuit includes an EXCLUSIVE-OR circuit for each data line of the group of data lines to compare a datum output via the respective data line with a read comparison datum, respective outputs of the EXCLUSIVE-OR circuits being connected to a respective input of a common assigned NOR circuit.

8. The integrated memory as claimed in claim 1, further comprising:
    a read-out circuit, including a combination circuit with a plurality of inputs and an output, the inputs being connected to the read/write data lines and the output being connected to the data output circuit, the combination circuit combining signals to be output via the read/write data lines to form a compressed signal, the compressed signal being forwarded to the data output circuit.

* * * * *